(12) United States Patent
Jory et al.

(10) Patent No.: US 6,501,103 B1
(45) Date of Patent: Dec. 31, 2002

(54) LIGHT EMITTING DIODE ASSEMBLY WITH LOW THERMAL RESISTANCE

(75) Inventors: Tom Jory, Taipei Hsien (TW); Po-Hsien Lee, Panchiao (TW); Chen-Lun Hsing Chen, Taipei Hsien (TW)

(73) Assignee: Lite-On Electronics, Inc., Taipei Hsien (TW)

( * ) Notice: Subject to any disclaimer, the term of this patent is extended or adjusted under 35 U.S.C. 154(b) by 0 days.

(21) Appl. No.: 09/983,133

(22) Filed: Oct. 23, 2001

(51) Int. Cl.⁷ .............................................. H01L 33/00
(52) U.S. Cl. ................. 257/100; 257/678; 257/712; 257/787; 257/675; 257/80; 257/81; 257/82
(58) Field of Search ................................. 257/678, 712, 257/734, 773, 774, 718, 719, 741, 750, 762, 787, 706, 707, 713, 717, 720, 432, 433, 434, 80, 675, 81, 82, 83, 85, 290, 291, 99, 100, 676; 362/800, 547, 294, 373

(56) References Cited

U.S. PATENT DOCUMENTS

| | | | |
|---|---|---|---|
| 5,223,747 A | * 6/1993 | Tschulena | 165/80.3 |
| 6,084,252 A | * 7/2000 | Isokawa et al. | 257/100 |
| 6,121,637 A | * 9/2000 | Isokawa et al. | 257/100 |
| 6,169,295 B1 | * 1/2001 | Koo | 257/100 |
| 6,180,962 B1 | * 1/2001 | Ishinaga | 257/100 |
| 6,281,435 B1 | * 8/2001 | Maekawa | 174/52.2 |
| 6,335,548 B1 | * 1/2002 | Roberts et al. | 250/239 |
| 6,342,670 B1 | * 1/2002 | Lin et al. | 136/244 |
| 6,362,964 B1 | * 3/2002 | Dubhashi et al. | 257/724 |

* cited by examiner

Primary Examiner—Nathan J. Flynn
Assistant Examiner—Pershelle Greene
(74) Attorney, Agent, or Firm—Rosenberg, Klein & Lee

(57) ABSTRACT

A light emitting diode assembly with low thermal resistance comprises an LED, a circuit board and a heat-dissipating substrate. The LED has a die mounted on a heat-dissipating plate and pads connected to a printed circuit board. The LED is mounted on a circuit board and a heat-dissipating substrate, whereby the thermal resistance of the LED assembly can be advantageously reduced to enhance the performance of the LED assembly.

7 Claims, 7 Drawing Sheets

LIGHT EMITTING DIODE ASSEMBLY WITH LOW THERMAL RESISTANCE

FIELD OF THE INVENTION

The present invention relates to a light emitting diode assembly with low thermal resistance, especially to a light emitting diode assembly with low thermal resistance equal to aerial thermal resistance.

BACKGROUND OF THE INVENTION

For the package of the conventional light emitting diode (LED), the LED is generally fixed on a leadframe by binding paste and then wire bonded to corresponding pads on the leadframe. Afterward the LED is encapsulated by epoxy and the packaged LED is soldered to a printed circuit board.

The LED in above-mentioned package has performance and life inversely proportional to the junction temperature of the LED with respect to the package. Therefore, the performance of LED is influenced by the heat dissipation effect provided by the package.

SUMMARY OF THE INVENTION

It is the object of the present invention to provide a light emitting diode with low thermal resistance equal to aerial thermal resistance.

In one aspect of the present invention, the die of the LED is arranged on a heat-dissipating plate and has pads connected to a printed circuit board.

In another aspect of the present invention, the LED is mounted on a circuit board and a heat-dissipating substrate, whereby the thermal resistance of the LED assembly can be advantageously reduced to enhance the performance of the LED assembly.

The various objects and advantages of the present invention will be more readily understood from the following detailed description when read in conjunction with the appended drawing, in which:

DETAILED DESCRIPTION OF THE INVENTION

Figure 1:
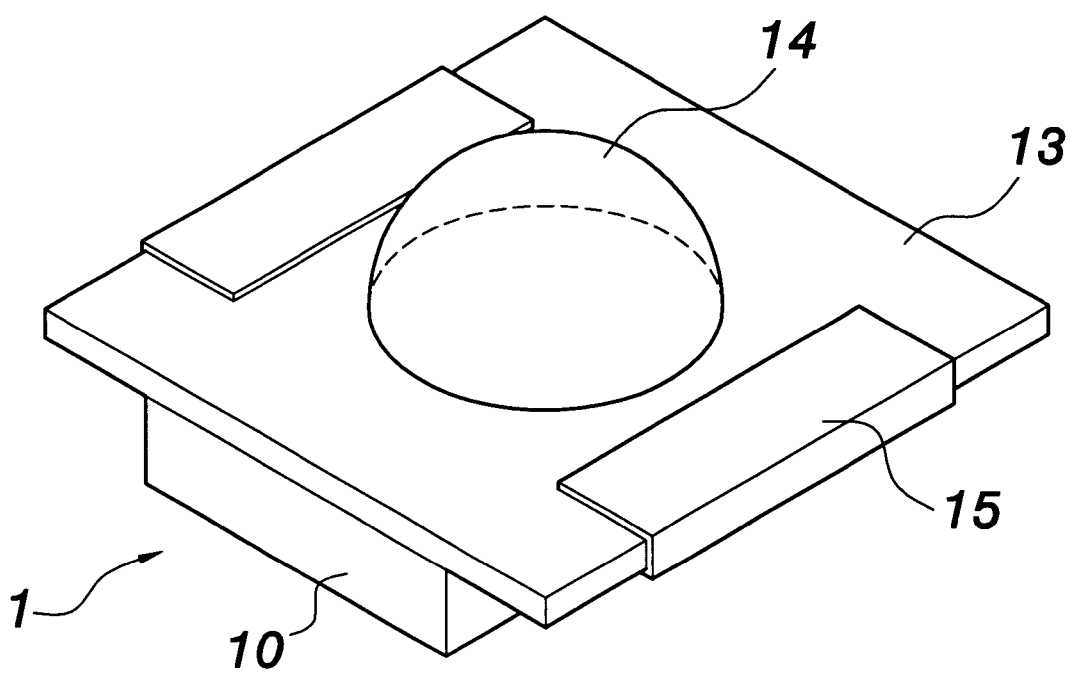
FIG. 1 shows the perspective view of the LED of the present invention.
Figure 2:
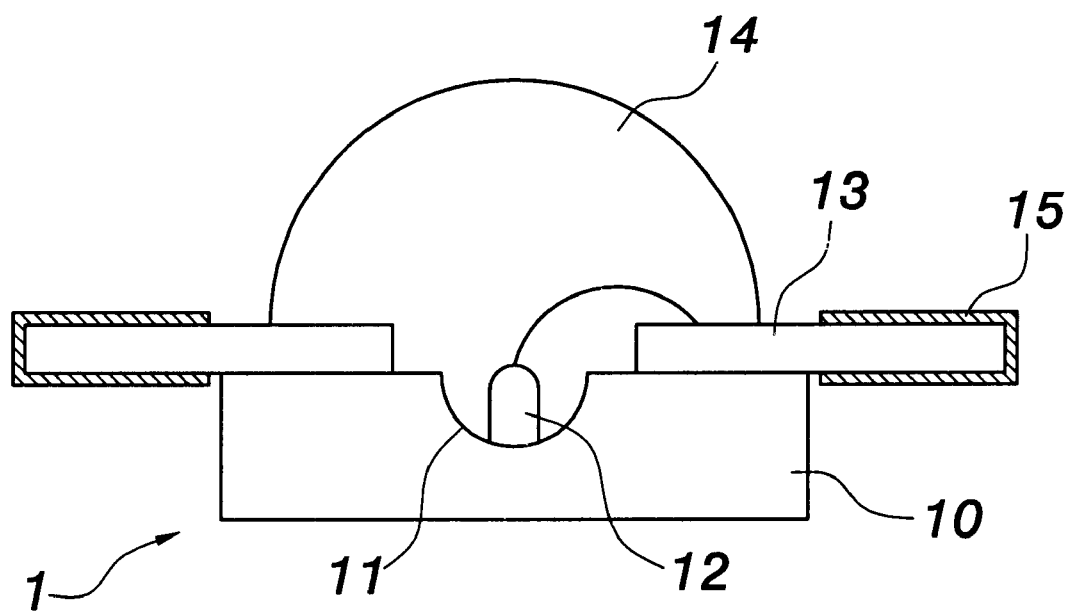
FIG. 2 shows the sectional view of the LED of the present invention.

With reference now to FIGS. 1 and 2, the present invention provides a light emitting diode assembly with low thermal resistance. The light emitting diode assembly comprises an LED 1, a circuit board 2 and a heat-dissipating substrate 3.

The LED 1 is provided with a heat-dissipating plate 10 with a recess 11.

The LED 1 has a die 12 bound within the recess 11 and the die 12 has pads (not shown) wire bonded to a printed circuit board 13. Moreover, a protective encapsulation 14 is formed atop the die 12.

Figure 3:
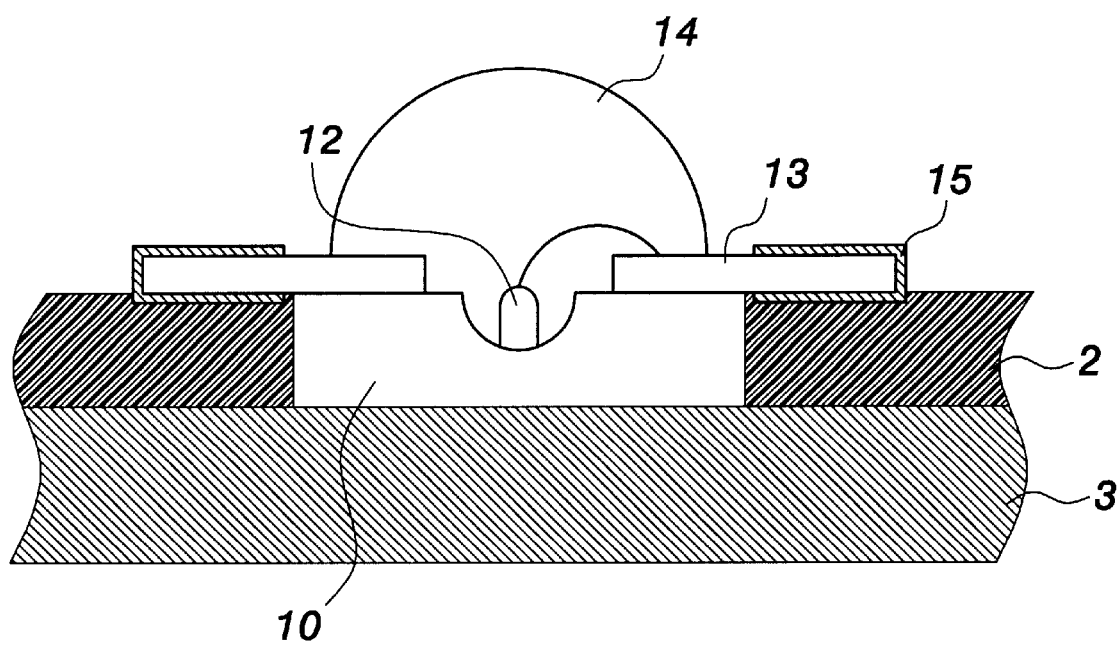
FIG. 3 shows the sectional view of the first preferred embodiment of the present invention.

As shown in FIGS. 1 to 3, the printed circuit board 13 has copper trace 15 thereon and the copper trace 15 can be connected to the circuit board 2 and the heat-dissipating substrate 3. Therefore, the heat generated by the die 12 can be dissipated out through the heat-dissipating plate 10 and the heat-dissipating substrate 3. The heat-dissipating plate 10 and the heat-dissipating substrate 3 provide a large heat-dissipating surface to the die 12, thus reducing the thermal resistance of the LED assembly.

Figure 4:
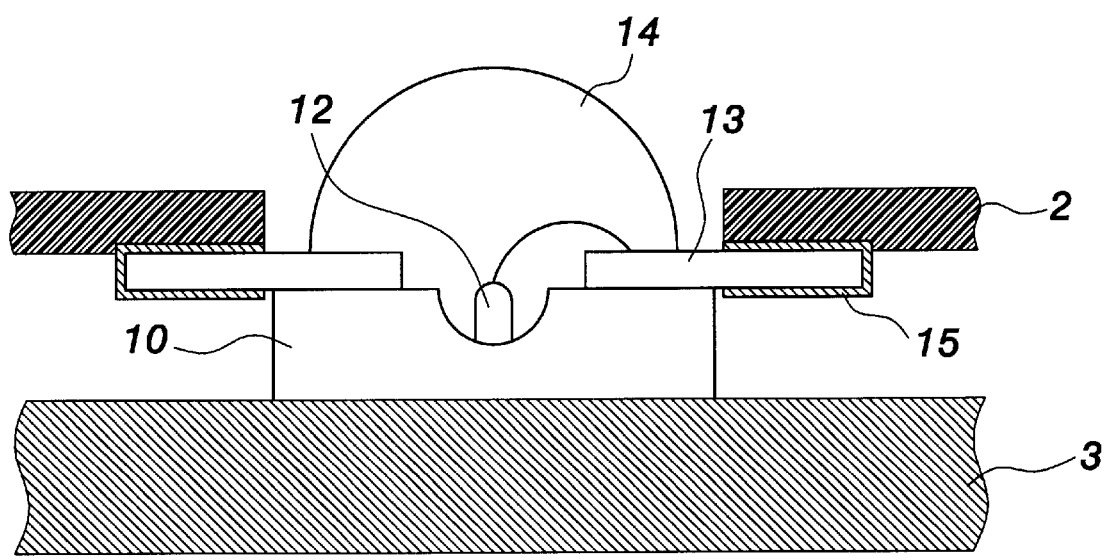
FIG. 4 shows the sectional view of the second preferred embodiment of the present invention.

FIG. 4 shows the sectional view of the second preferred embodiment of the present invention. The printed circuit board 13 is connected to the circuit board 2 through the copper trace 15 and the heat-dissipating plate 10 is directly in contact with the heat-dissipating substrate 3 on bottom thereof. The thermal resistance of the LED assembly can be advantageously reduced to enhance the performance of the LED assembly.

Figure 5:
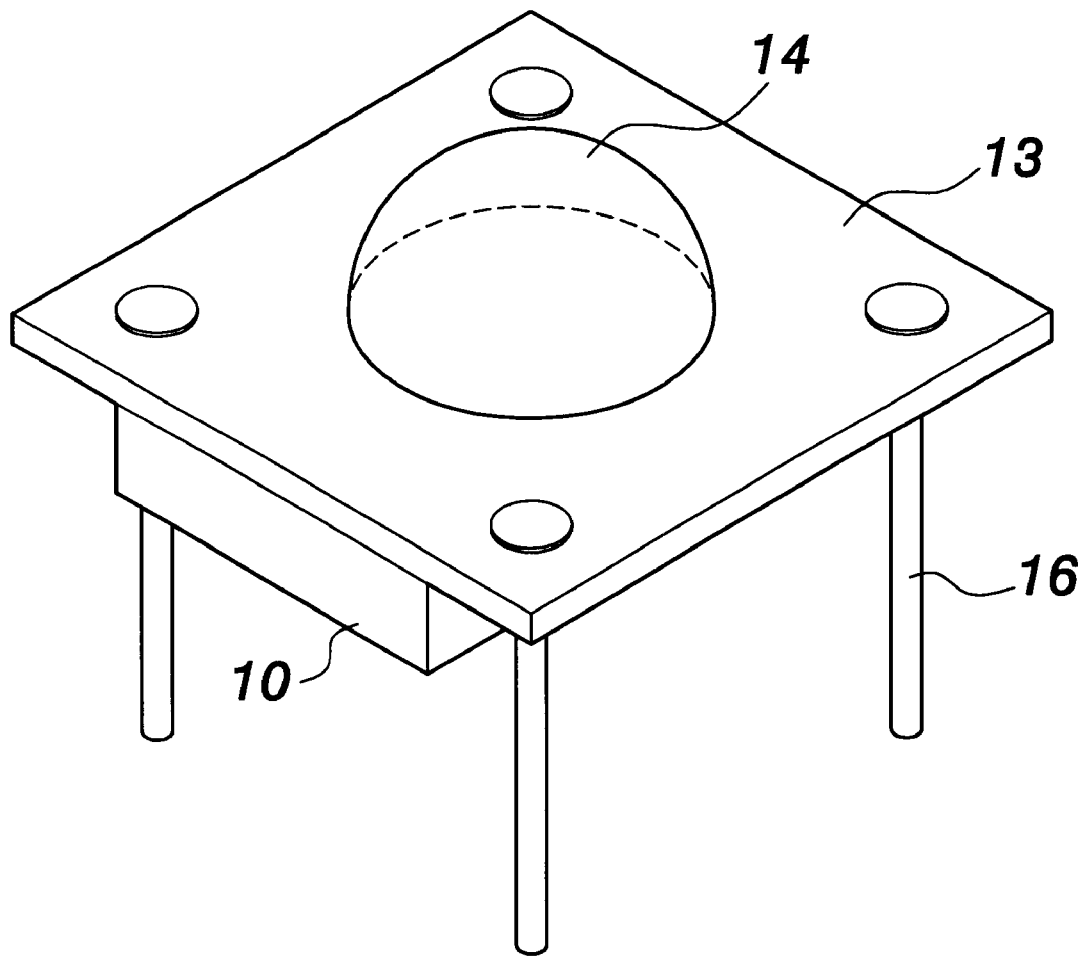
FIG. 5 shows the perspective view of the second preferred embodiment of the present invention.
Figure 6:
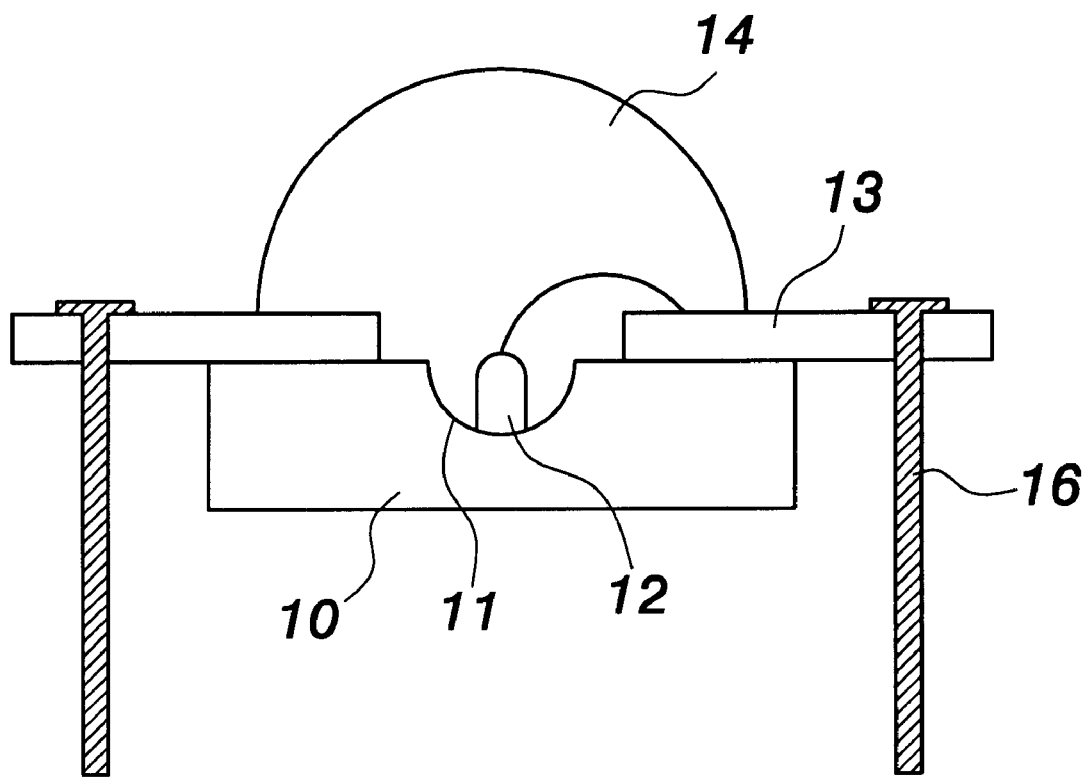
FIG. 6 shows the sectional view of the LED of the second preferred embodiment of the present invention.
Figure 7:
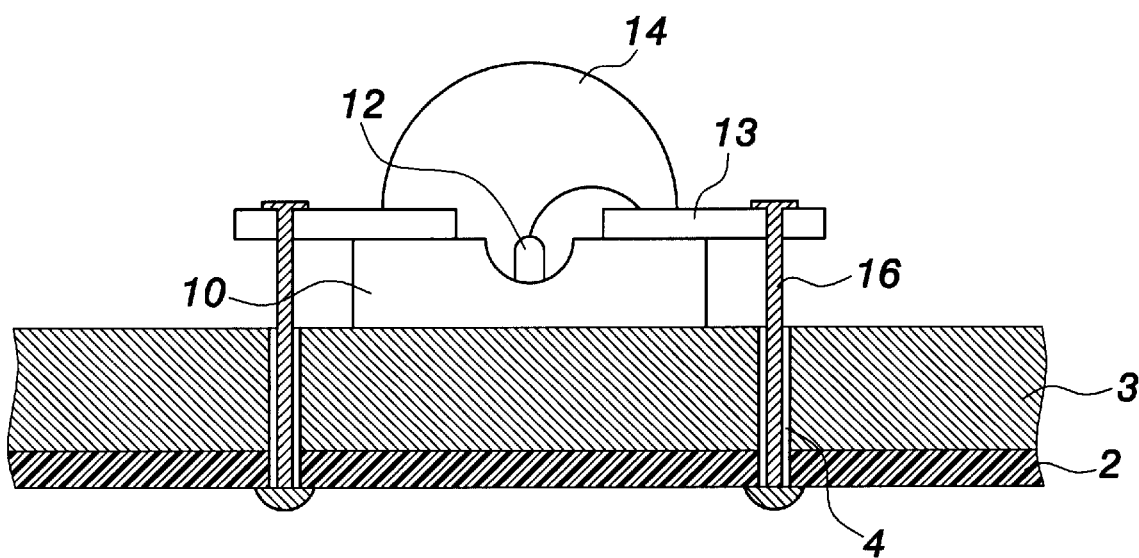
FIG. 7 shows the sectional view of the third preferred embodiment of the present invention.

As shown in FIGS. 5 to 7, the printed circuit board 13 of the LED assembly is connected to the circuit board 2 and the heat-dissipating substrate 3 through a plurality of pins 16 or connector (not shown). The thermal resistance of the LED assembly can be advantageously reduced to enhance the performance of the LED assembly.

As shown in FIG. 7, the circuit board 2 and the heat-dissipating substrate 3 have a plurality of via holes 4 therein, through which the pins 16 pass and are solder on distal ends thereof. The thermal resistance of the LED assembly can be advantageously reduced to enhance the performance of the LED assembly.

As can be seen from above description, the thermal resistance of the LED assembly can be advantageously reduced and the LED assembly can be applied to illumination utility, traffic sign and warning devices.

Although the present invention has been described with reference to the preferred embodiment thereof, it will be understood that the invention is not limited to the details thereof. Various substitutions and modifications have suggested in the foregoing description, and other will occur to those of ordinary skill in the art. For example, the printed circuit board and circuit board can be rigid circuit board, flexible circuit board, metal frame or circuit trace on a metal plate. Therefore, all such substitutions and modifications are intended to be embraced within the scope of the invention as defined in the appended claims.

We claim:

1. A light emitting diode assembly with low thermal resistance, comprising:

a light emitting diode having a heat-dissipating plate having a central recess formed therein, a die positioned in contact with said heat dissipating plate within said recess, a printed circuit board positioned atop said heat dissipating plate and having a central aperture formed therein and circumscribing said die, and a protective encapsulation formed atop the die;

a heat-dissipating structure connected to the heat-dissipating plate; and a circuit board connected to the heat-dissipating substrate, said circuit board having a central opening formed therein and circumscribing said heat dissipating plate.

2. The light emitting diode assembly with low thermal resistance as in claim 1, wherein the printed circuit board is connected to the circuit board and the heat-dissipating substrate through a plurality of pins, at least one copper trace or a connector.

3. The light emitting diode assembly with low thermal resistance as in claim 1, wherein the printed circuit board and the circuit board include either of a group including a rigid circuit board, flexible circuit board, metal frame, and a circuit trace on a metal plate.

4. The light emitting diode assembly with low thermal resistance as in claim 2, wherein each of the circuit board and the heat-dissipating structure has a plurality of via holes through which the pins of the printed circuit board pass.

5. A light emitting diode assembly with low thermal resistance, comprising:
- a light emitting diode having a heat-dissipating plate having a central recess formed therein, a die positioned in contact with said heat dissipating plate within said recess, a printed circuit board positioned atop said heat-dissipating plate and having a central opening formed therein and circumscribing said die, and a protective encapsulation formed atop the die;
- a heat-dissipating substrate connected to the heat-dissipating plate; and
- a circuit board positioned atop the printed circuit board and having a central opening circumscribing said protective encapsulation.

6. The light emitting diode assembly with low thermal resistance as in claim 5, wherein the printed circuit board is connected to the circuit board and the heat-dissipating substrate through a plurality of pins, at least one copper trace or a connector.

7. The light emitting diode assembly with low thermal resistance as in claim 5, wherein the printed circuit board and the circuit board include either of a group including a rigid circuit board, flexible circuit board, metal frame, and a circuit trace on a metal plate.

* * * * *